United States Patent
Morizumi et al.

(10) Patent No.: US 7,521,729 B2
(45) Date of Patent: Apr. 21, 2009

(54) NITRIDE SEMICONDUCTOR LASER ELEMENT HAVING IMPURITY INTRODUCTION REGION

(75) Inventors: Tomonori Morizumi, Anan (JP); Atsuo Michiue, Komatsushima (JP); Shingo Tanisaka, Anan (JP)

(73) Assignee: Nichia Corporation, Anan-shi (JP)

( * ) Notice: Subject to any disclaimer, the term of this patent is extended or adjusted under 35 U.S.C. 154(b) by 4 days.

(21) Appl. No.: 11/655,117

(22) Filed: Jan. 19, 2007

(65) Prior Publication Data

US 2007/0184591 A1  Aug. 9, 2007

(30) Foreign Application Priority Data

Jan. 26, 2006  (JP) .............................. 2006-017569
Dec. 28, 2006  (JP) .............................. 2006-353718

(51) Int. Cl.
| | |
|---|---|
| H01L 29/24 | (2006.01) |
| H01L 33/00 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15 | (2006.01) |
| H01L 29/26 | (2006.01) |
| H01L 31/12 | (2006.01) |
| H01L 29/22 | (2006.01) |

(52) U.S. Cl. .......................... 257/101; 257/13; 257/79; 257/94; 257/102; 257/103

(58) Field of Classification Search ................... 257/13, 257/79, 94, 101–103
See application file for complete search history.

(56) References Cited

U.S. PATENT DOCUMENTS

| | | | | |
|---|---|---|---|---|
| 6,586,762 | B2 * | 7/2003 | Kozaki | 257/14 |
| 6,617,607 | B2 * | 9/2003 | Ito et al. | 257/22 |
| 6,693,935 | B2 * | 2/2004 | Tojo et al. | 372/45.01 |
| 6,858,877 | B2 * | 2/2005 | Kawaguchi et al. | 257/97 |
| 6,924,512 | B2 * | 8/2005 | Tsuda et al. | 257/97 |
| 7,103,082 | B2 * | 9/2006 | Sugimoto et al. | 372/50.1 |
| 7,132,730 | B2 * | 11/2006 | Dwilinski et al. | 257/615 |
| 7,211,822 | B2 * | 5/2007 | Nagahama et al. | 257/22 |
| 7,221,690 | B2 * | 5/2007 | Hasegawa et al. | 372/43.01 |
| 7,230,263 | B2 * | 6/2007 | Kawagoe | 257/13 |

(Continued)

FOREIGN PATENT DOCUMENTS

JP  H07-249830 A  9/1995

(Continued)

*Primary Examiner*—Ida M Soward

(74) *Attorney, Agent, or Firm*—Global IP Counselors, LLP

(57) ABSTRACT

A nitride semiconductor laser element, has: a nitride semiconductor layer including a first nitride semiconductor layer, an active layer, and a second nitride semiconductor layer laminated in that order; and resonator end faces formed mutually opposing at the end of said nitride semiconductor layers, wherein an impurity is contained in at least an optical output region of the resonator end faces, with the concentration of said impurity having a concentration distribution that is asymmetric in reference to a peak position, in the lamination direction of the nitride semiconductor layers, and said optical output region has a wider bandgap than other regions in the active layer or said optical output region has a higher impurity concentration than other regions in the active layer.

20 Claims, 9 Drawing Sheets

U.S. PATENT DOCUMENTS

| | | | |
|---|---|---|---|
| 7,312,468 B2 * | 12/2007 | Watanabe et al. | 257/14 |
| 7,323,724 B2 * | 1/2008 | Sugimoto et al. | 257/99 |
| 2002/0005521 A1 * | 1/2002 | Tanabe et al. | 257/79 |
| 2002/0053676 A1 * | 5/2002 | Kozaki | 257/88 |
| 2003/0205736 A1 * | 11/2003 | Kozaki | 257/200 |
| 2004/0056242 A1 * | 3/2004 | Ohno et al. | 257/13 |
| 2004/0264533 A1 * | 12/2004 | Matsumura et al. | 372/45 |
| 2005/0127391 A1 * | 6/2005 | Yanamoto | 257/103 |
| 2005/0224783 A1 * | 10/2005 | Matsuyama et al. | 257/14 |

FOREIGN PATENT DOCUMENTS

| | | |
|---|---|---|
| JP | 2002-261379 A | 9/2002 |
| JP | 2003-101198 A | 4/2003 |
| JP | 2003-114654 A | 4/2003 |
| JP | 2003-188470 A | 7/2003 |
| JP | 2005-175111 A | 6/2005 |
| JP | 2005-219660 A | 8/2005 |

* cited by examiner

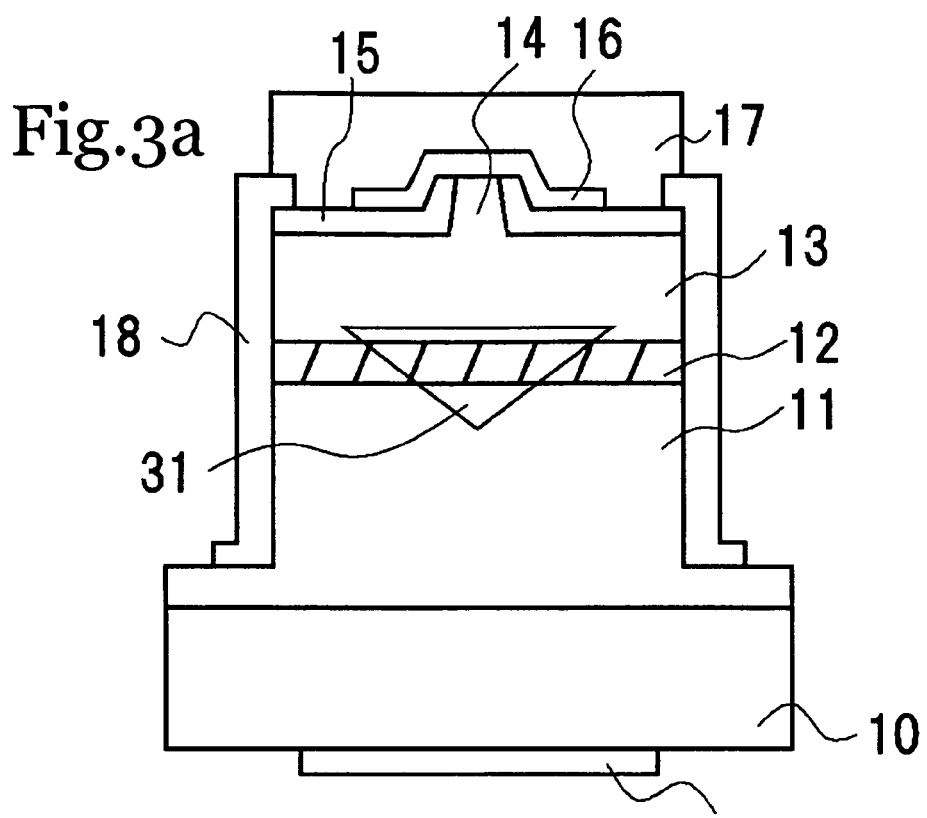
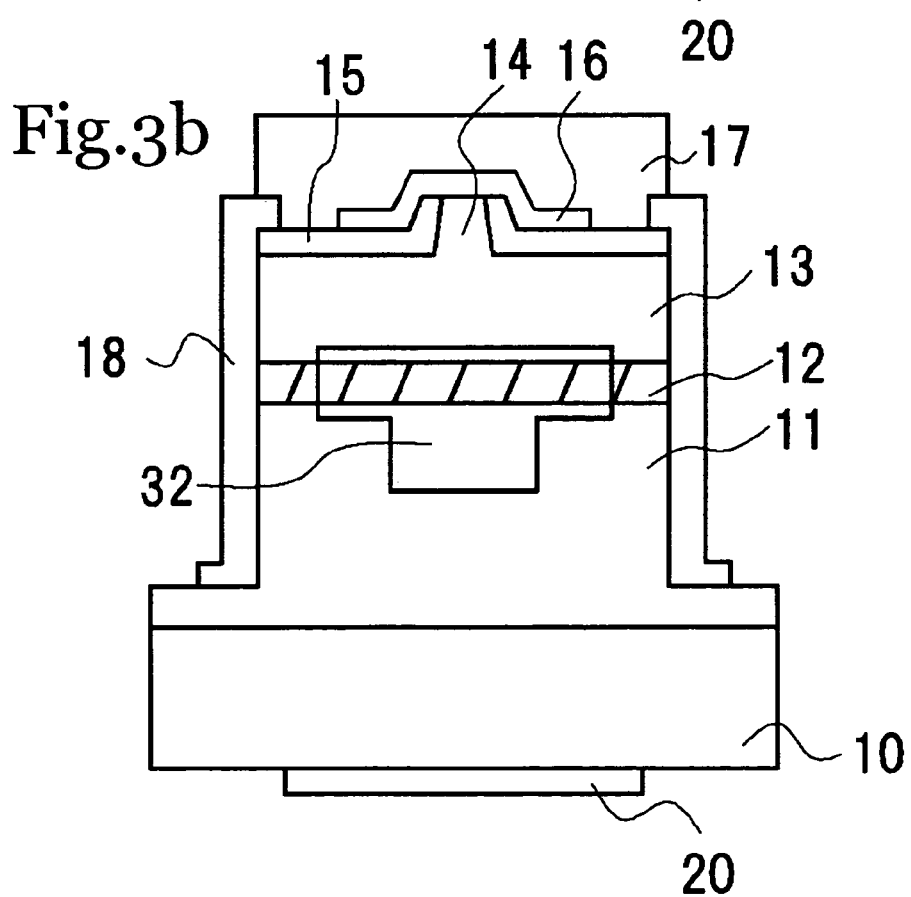

NITRIDE SEMICONDUCTOR LASER ELEMENT HAVING IMPURITY INTRODUCTION REGION

BACKGROUND OF THE INVENTION

1. Field of the Invention

The present invention relates to a nitride semiconductor laser element and to a method for manufacturing this element, and more particularly relates to a nitride semiconductor laser element that exhibits good reliability even when driven continuously in a high-output state, and to a method for manufacturing this element.

2. Background Information

A nitride semiconductor is formed from an $In_xAl_yGa_{1-x-y}N$ ($0 \leq x$, $0 \leq y$, $0 \leq x+y \leq 1$) compound semiconductor, and a semiconductor laser element made from this semiconductor is increasing uses in next-generation DVDs and other such optical disk systems capable of high-capacity, high-density information recording and reproduction, and in personal computers and other such electronic devices, as well as is continuing to rise in applications such as light sources for optical networks, laser printers, and so on because it is believed to be capable of oscillation over a wide band of visible light wavelengths, from the ultraviolet band to the red band. Accordingly, semiconductor laser elements that make use of nitride semiconductors have been the subject of a great deal of research.

For example, the bandgap energy of a nitride semiconductor decreases when an impurity state is formed on resonator end faces, so outputted light is absorbed at resonator end faces formed by cleavage or RIE (reactive ion etching), and this absorption generates heat at the resonator end faces. The heat that is generated raises the temperature at the resonator end faces, decreases the bandgap at the resonator end faces, and increases the absorption of outputted light. This results in catastrophic optical damage (COD) to the end face.

Consequently, to obtain a laser with high output, it is very important to suppress the generation of heat at resonator end faces by suppressing the absorption of light at the end face.

One proposal aimed at this goal is a method for forming a window structure in a nitride semiconductor laser element, or forming an AlGaInN semiconductor film as a protective film for an end face (such as Japanese Laid-Open Patent Application H7-249830).

Also, as shown in FIG. 9a, a laminated semiconductor structure (11, 12, 13) of an optical device is formed, after which ions 37 are implanted in a contact layer disposed on the surface of the laminated structure near resonator end faces 30, and as shown in FIG. 9b, a current non-implantation region 33 is formed to form an optical non-absorption region in the resonator end faces 30 (such as Japanese Laid-Open Patent Application 2002-261379).

With these methods, however, it is difficult to adjust the beam shape of the laser outputted from the resonator end faces, or the active layer is damaged during the manufacturing process, for example, so it is still impossible to adequately maintain the characteristics at the resonator end faces while preventing end face deterioration.

SUMMARY OF THE INVENTION

The present invention was conceived in light of the above situation, and it is a particular object thereof to provide a nitride semiconductor laser element and a method for manufacturing this element with which the bandgap is widened for the optical output region of resonator end faces in a nitride semiconductor laser element, thereby making it possible to suppress optical absorption in this region, suppress heat generation, and maintain laser element characteristics while still affording continuous, high-output drive.

A nitride semiconductor laser element according to a first aspect of the present invention has:

a nitride semiconductor layer comprising a first nitride semiconductor layer, an active layer, and a second nitride semiconductor layer laminated in that order; and resonator end faces formed mutually opposing at the end of said nitride semiconductor layers, wherein an impurity is contained in at least an optical output region of the resonator end faces, with the concentration of said impurity having a concentration distribution that is asymmetric in reference to a peak position, in the lamination direction of the nitride semiconductor layers, and said optical output region has a wider bandgap than other regions in the active layer.

A nitride semiconductor laser element according to a second aspect of the present invention has:

a nitride semiconductor layer comprising a first nitride semiconductor layer, an active layer, and a second nitride semiconductor layer laminated in that order; and resonator end faces formed mutually opposing at the end of said nitride semiconductor layers, wherein an impurity is contained in at least an optical output region of the resonator end faces, with the concentration of said impurity having a concentration distribution that is asymmetric in reference to a peak position, in the lamination direction of the nitride semiconductor layers, and said optical output region has a higher impurity concentration than other regions in the active layer.

A method for manufacturing a nitride semiconductor laser element according to a third aspect of the present invention, comprises the steps of:

(a) forming a nitride semiconductor layer including at least a first nitride semiconductor layer and an active layer;

(b) forming over said active layer a protective layer having a first region and a second region that is thicker than the first region;

(c) implanting an ion species in the nitride semiconductor layer via the protective layer so that the ions reach the active layer through the protective layer in the first region of the protective layer;

(d) exposing the nitride semiconductor layer by removing the protective layer;

(e) forming a second nitride semiconductor layer over said nitride semiconductor layer; and (f) dividing the nitride semiconductor layer so that the portion where the ion species is implanted to be the resonator end face on the optical output side.

The present invention is constituted such that the absorption of light by a nitride semiconductor layer and electrodes on or near the resonator end faces of a nitride semiconductor laser element can be suppressed, and therefore the generation of heat near the end face is prevented and the characteristics of the end face can be enhanced. As a result, the nitride semiconductor laser element of the present invention has a longer service life for the element itself, and output is also raised.

Also, with the method of the present invention for manufacturing a nitride semiconductor laser element, a protective layer whose thickness varies partially is used as a mask in the implantation of an ion species, and the portion where the ion species is implanted constitutes the optical output end face of the resonator of the laser element, and as a result, optical absorption, current implantation near the resonator end faces, and other such characteristics can be easily and effectively controlled.

BRIEF DESCRIPTION OF THE DRAWINGS

FIGS. 3a and 3b comprises simplified cross sections illustrating the position of the region where ions are implanted at the resonator end faces in the nitride semiconductor laser element of the present invention;

DETAILED DESCRIPTION OF THE PREFERRED EMBODIMENTS

Figure 1A:
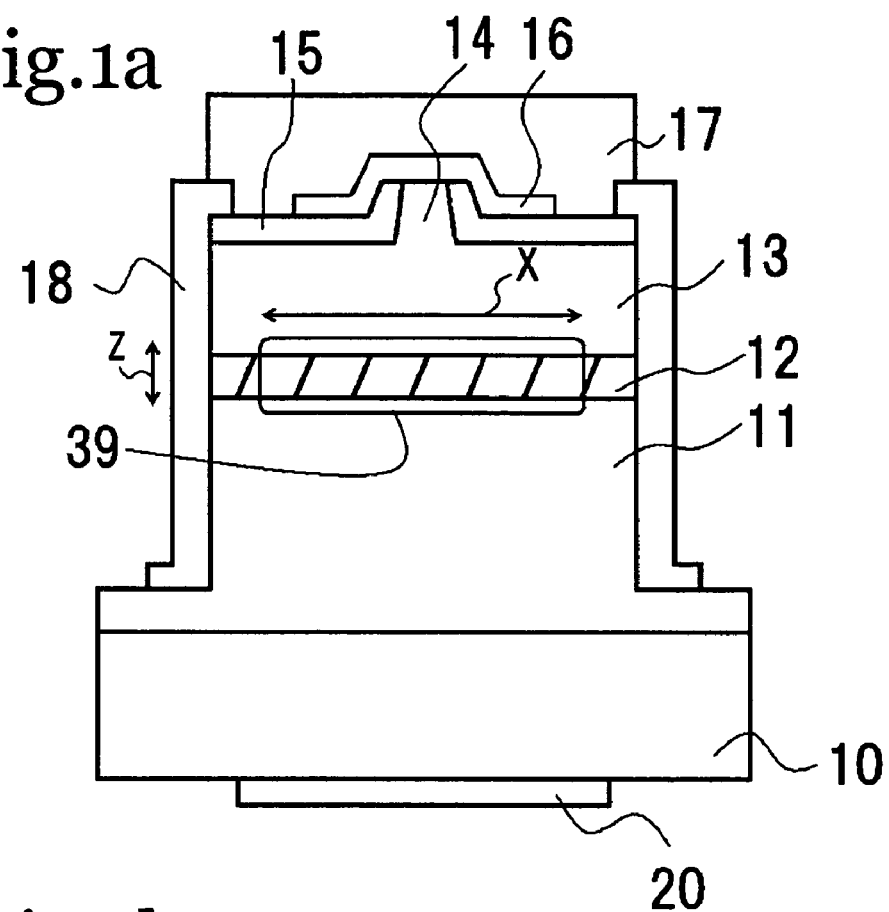
FIGS. 1a and 1b comprise simplified cross sections of the main components, for illustrating the structure of the nitride semiconductor laser element of the present invention.
Figure 1B:
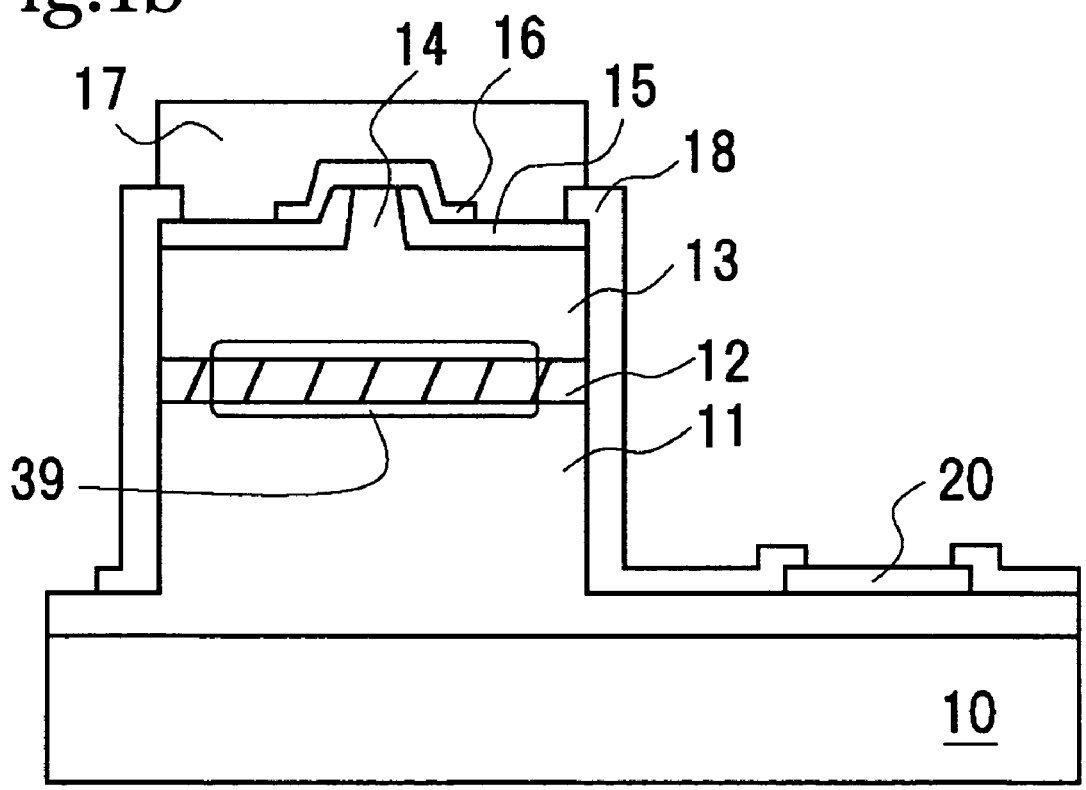
Figure 2A:
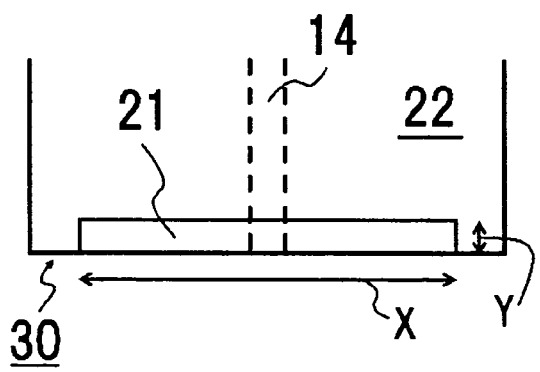
FIG. 2a to 2d comprise simplified plan views illustrating the position of the region where ions are implanted in the nitride semiconductor laser element of the present invention.
Figure 2B:
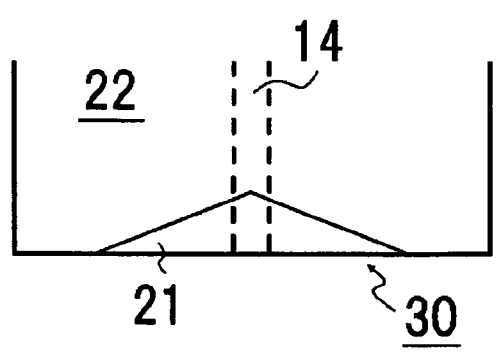
Figure 2C:
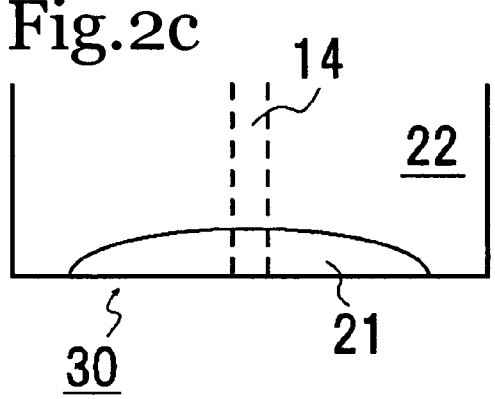
Figure 2D:
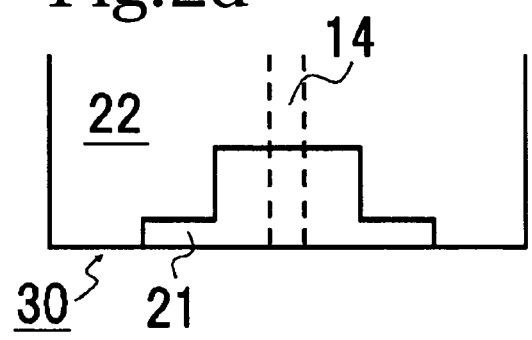

As shown in FIG. 1a, for example, the nitride semiconductor element of the present invention is constituted by forming, in the following order, a first (such as an n-side) nitride semiconductor layer 11, an active layer 12, and a second (such as a p-side) nitride semiconductor layer 13 over the first main face of a substrate 10 having a first main face and a second main face. A stripe-like ridge 14 that extends in the resonator direction is formed on the surface of the second nitride semiconductor layer 13. A p-electrode 16 is formed on the upper face of the ridge 14, and an n-electrode 20 is formed on the second main face of the substrate 10. As shown in FIG. 1b, the p-electrode 16 and the n-electrode 20 may instead be formed on the upper face of the substrate.

This nitride semiconductor laser element is such that mutually opposing resonator end faces are usually made up of two faces, on the optical output side and the monitor side, in the lengthwise direction of the ridge 14. With the nitride semiconductor laser of the present invention, an impurity introduction region 39, in which an impurity is introduced into at least the optical output region (hereinafter sometimes referred to as the "ion implantation region or impurity introduction region"), is formed on at least the resonator end face on the optical output side. Put another way, the impurity introduction region 39 includes at least a region that coincides with the near field pattern (NFP).

The impurity introduction region 39 refers to a state in which the crystal system thereof is at first partially destroyed by the ion implantation, after which the crystal system is easy to restore, or the crystal system is substantially restored. Alternatively, it refers to a region in which an impurity has been introduced by diffusion or the like. This should be clear from a comparison, by observation with a TEM or the like, of a crystal system in which the crystals have been restored, with a perfect crystal system immediately after the formation of the active layer or that of another region of the active layer in which no ions have been implanted (hereinafter referred to simply as "other regions"). An impurity introduction region 19 is a region in a state in which the active layer is mixed with the atoms constituting the layer above or below, this region having a composition that is different from the composition in a perfect crystal system of other regions or immediately after the active layer is formed. Alternatively, it is a region having a bandgap that is different from the bandgap of a perfect crystal system of other regions or immediately after the active layer is formed, i.e., is a region having a bandgap wider than the bandgap of a perfect crystal system of other regions or immediately after the active layer is formed, or is a region having a resistance higher than the resistance of a perfect crystal system of other regions or immediately after the active layer is formed. Alternatively, the transmissivity has been completely restored, or is better. This effectively prevents the absorption of light near the resonator end faces. The difference between the two bandgaps is, for example, about 0.5 nm or more, and preferably about 3 nm or more.

As will be discussed below, an impurity that originally exhibits n-type or p-type conductivity is diffused into the impurity introduction region so that the layers that make up this region will exhibit a specific function, but in addition to this, there is a portion in which an impurity or ion species has been introduced for changing the crystal system of these layers. The impurity or ion species for changing the crystal system is at least one selected from the group consisting of oxygen, boron, aluminum, zinc, beryllium, carbon, magnesium, calcium, and nitrogen and these atoms are diffused in at least the impurity introduction region in a concentration of about $1 \times 10^{15}/cm^3$ to about $1 \times 10^{23}/cm^3$, and preferably about $1 \times 10^{16}/cm^3$ to about $1 \times 10^{20}/cm^3$, for example. The desired change in the crystal system and widening of the bandgap can be imparted by varying the ion species and ion concentration.

The impurity introduction region is usually disposed from the resonator end faces to the inner side of the element, and from the active layer to the first nitride semiconductor layer and/or the second nitride semiconductor layer. There are no particular restrictions on the size of the region, which can be suitably adjusted according to the compositions of the active layer, the first and second nitride semiconductor layers, and so forth, the performance of the laser element, and other such factors. The height (see Z in FIG. 1a) is, for example, within a range of about 1 μm vertically from the active layer, or is favorably within about 20 times the active layer thickness on either side of the active layer. More specifically, the height is from about 100 Å to about 0.3 μm, for example. However, the impurity introduction region does not necessarily have to be vertically symmetrical with respect to the active layer. Furthermore, the impurity concentration in the impurity introduction region usually has a concentration distribution (preferably continuous) in the lamination direction of the nitride semiconductor layer. The width (see X in FIG. 1a) can be, for example, from about the same as the ridge width to about the same as the element width, with about 1.0 to 20 times the ridge with being preferable, and about 1.5 to 6 times being better yet. More specifically, the width is from about 1 to about 50 μm, for example. Controlling this width makes it possible to control optical confinement. The depth (that is, the length into the element interior) is, for example, at least about 1.0 μm from the resonator end faces, or is favorably about 0.1 to 3% the resonator length. More specifically, the depth is from about 1 to about 20 μm, for example.

In general, a nitride semiconductor has hard crystals and relatively high resistance, so as the output rises, deterioration caused by heat generated near the resonator end faces becomes more pronounced, but if the impurity introduction region is set to the above ranges and configuration, it will have no effect on the optical output of a laser element, current implantation is reduced only near the resonator end faces, and heat generation by resistance can be efficiently prevented. In addition, the absorption of light near the resonator end faces is prevented, so the generation of heat is prevented even better. As a result, the COD level is raised and the service life of the laser element is extended.

The ridge functions as a waveguide region, and its width is preferably about 1.0 to 30.0 μm, more specifically, the width is from about 1.0 to about 3.0 μm, for example. Its height (depth of etching) can be suitably adjusted according to the thickness, material, etc., of the layers constituting the p-side semiconductor layer, and is about 0.1 to 2 μm, for example. Furthermore, the ridge is preferably set such that its length in the resonator direction is about 100 to 1000 μm. Also, the ridge need not have the same width over its entire length in the resonator direction, and its side faces may be vertical or tapered. If tapered, the taper angle is favorably about 45° to 90°.

The electrodes, that is, the p-electrode and n-electrode, can be formed by a single-layer or laminated film of palladium, platinum, nickel, gold, titanium, tungsten, copper, silver, zinc, tin, indium, aluminum, iridium, rhodium, ITO or another such metal or alloy. The film thickness of the electrodes can be suitably adjusted according to the material being used and so forth, and about 500 to 5000 Å is favorable, for example. The electrodes may be formed on at least the p-side and n-side semiconductor layers or the substrate, and one or more pad electrodes or other conductive layers may be further formed over the electrodes.

In particular, the p-electrode is electrically connected to the ridge, and while there are no particular restrictions on its shape, it is usually wider than the ridge and formed in the direction in which the ridge extends. With the p-electrode, the electrode end face on the resonator side may be formed substantially coinciding with the resonator end faces, or not coinciding with the resonator end faces and instead disposed more to the inside of the element than the resonator end faces. The end face of the p-electrode is preferably disposed more to the inside of the element than the resonator end faces. With a nitride semiconductor laser element, in general, the resonator end faces are formed by cleavage or RIE (reactive ion etching). When resonator end faces are formed by RIE, it has been difficult to form a structure in which the resonator end faces coincide with the electrode end face with good reproducibility, and a problem has been that the electrodes come around into the resonator end faces. When resonator end faces are formed by cleavage, a problem has been that the electrodes separate during the cleavage. If the electrodes are formed away from the resonator end faces in an effort to solve these problems, then the problem of rise-kink (i.e., kink immediately after oscillation) occurs because an optical absorption region that does not contribute to oscillation is formed. Also, heat is generated when outputted light is absorbed at the resonator end faces, and this raises the temperature of the resonator end faces and reduces the bandgap at the resonator end faces, so there may be an increase in the absorption of outputted light. This results in catastrophic optical damage (COD) to the end face.

If, as in the present invention, an impurity-containing region is formed and the end face of the electrode on the optical output side is disposed more to the inside of the element than the resonator end face on the optical output side, separation between the nitride semiconductor and the electrodes or electrode sag will be suppressed, and the absorption of light by the electrodes and nitride semiconductor layer on or near the resonator end faces can also be reduced. This prevents heat generation near the end face, improves the characteristics and service life of the end face, and extends the service life and raises the output of the semiconductor laser element itself. It is particularly favorable for the electrode end face of the resonation face on the optical exit side to be more to the inside than the resonator end faces. Also, the end face on the inner side of the element of the region containing the impurity preferably coincides with the forward electrode end face on the optical exit side, or overlaps this electrode. Doing all this allows the effects discussed above to be manifested more efficiently.

Also, if the nitride semiconductor layer is formed in a quadrangular shape, for example, the electrodes are usually formed in substantially the same shape. For instance, the electrode end face is usually disposed parallel or substantially parallel (in the same plane) to the resonator end faces (although the electrode end face does not necessarily have to be disposed parallel or substantially parallel to the resonator end face). Therefore, it is favorable for all of the electrode end face to be disposed to the inside of the element at the resonator end face on the optical output region side. The distance between the electrode end face and the resonator end face on the optical output region side will vary with the size of the nitride semiconductor laser element, but about 0.1 μm or more is favorable, preferably about 1.0 μm or more, more preferably about 2.0 to 3.0 μm, for example. This allows current injection near the resonator end face on the optical output region side to be reduced, and also prevents the absorption of light by electrodes near the resonator end faces, so less heat will be generated in this vicinity. It is also preferable for the electrode to be narrower near the resonator end faces, particularly on the optical output region side, than to the inside of the element. This allows the effects discussed above to be manifested more efficiently.

With this laser element, it is preferable for the first protective film 15 (see FIG. 1a) to be formed from the ridge side faces to the surface of the second nitride semiconductor layer. The first protective film is formed, for example, from an insulating material with a lower refractive index than the nitride semiconductor layer. More specifically, examples include one or more layers of an oxide, nitride, or the like of zirconium, silicon, vanadium, niobium, hafnium, tantalum, aluminum or the like. Thus forming the first protective film from the side faces of the ridge to the surface of the nitride semiconductor layer on both sides of the ridge ensures a refractive index differential with respect to the nitride semiconductor layer, and particularly the p-side semiconductor layer, allowing the leakage of light from the active layer to be controlled, and allowing light to be efficiently confined in the ridge, and also allowing better insulation to be ensured near the bottom part of the ridge, and avoiding the occurrence of leak current. There are no particular restrictions on the thickness of the first protective film, but about 100 to 20,000 Å is favorable, more preferably about 100 to 5,000 Å, for example.

A second protective film 18 (see FIG. 1a) is preferably formed over the first protective film 15. The second protective film is to be disposed over the first protective film on at least the surface of the nitride semiconductor layer, but preferably also covers the side faces of the nitride semiconductor layer and/or the side faces or surface of the substrate, etc via or not via the first protective film. The second protective film can be formed from the same material as the first protective film. This not only ensures good insulation, but also protects the exposed side faces, surface, etc.

With the method of the present invention for manufacturing a nitride semiconductor laser element, first, in step (a), a nitride semiconductor layer including at least a first nitride semiconductor layer and an active layer is formed.

The nitride semiconductor layer is usually formed on a substrate. There are no particular restrictions on the substrate, and any known-type may be used. For instance, a nitride semiconductor substrate having an off angle of at least 0° and no more than 10° at the first main face and/or the second main face can be used, and the thickness thereof can be about 50 μm to 100 μm, for example. The first main face can be the face where the nitride semiconductor layer is grown, while the second main face can be the face where electrodes are formed. The nitride semiconductor substrate can be formed by a vapor phase growth method such as MOCVD, HVPE, MBE, or the like, a hydrothermal synthesis method in which crystals are grown in a supercritical fluid, a high pressure method, a flux method, a melt method, or the like. A commercially available product may also be used. A buffer layer, intermediate layer, or other layer, either as a single layer or a multilayer film, may also be formed on the substrate surface ahead of time.

The nitride semiconductor layer comprises at least a first nitride semiconductor layer (such as an n-side semiconductor layer) and an active layer, formed in that order. There are no restrictions on these nitride semiconductor layers, but it is preferable to use a SCH (Separate Confinement Heterostructure) structure, in which an optical guide layer that constitutes an optical waveguide is provided to the n-side semiconductor layer and a p-side semiconductor layer (discussed below), and an active layer is sandwiched in between.

The semiconductor layer can be used a nitride semiconductor of InxAlyGa1−x−yN ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The n-side semiconductor layer may include a nitride semiconductor which is doped with at least one n-type impurity such as Si, Ge, Sn, S, O, Ti, Zr, Cd etc. and the p-side semiconductor layer (discussed below) may include a nitride semiconductor which is doped with at least one p-type impurity such as Mg, Zn, Cd, Be, Ca, and Ba etc. The doped concentration is, for example, about $1 \times 10^{15}/cm^3$ to about $1 \times 10^{23}/cm^3$, and preferably about $1 \times 10^{16}/cm^3$ to about $1 \times 10^{21}/cm^3$. When the n-side or p-side semiconductor layer formed as multilayer film structure or superlattice structure (as discussed below), all of layers in the n-side or p-side semiconductor layers may not necessarily contain n-type or p-type impurity.

The semiconductor layers can be formed by using any known methods in the art, such as MOVPE (metal-organic vapor phase epitaxy), MOCVD (metal-organic chemical vapor deposition), HVPE (hydride vapor phase epitaxy), and MBE (molecular beam epitaxy) etc. Especially, MOCVD is preferable to be able to grow up crystal characteristics well. The first nitride semiconductor layer and the active layer may be formed as a single layer structure, multilayer film structure or superlattice structure of two different composition layer.

When the first nitride semiconductor layer is n side semiconductor layer, the second semiconductor layer is p side semiconductor layer, whereas the second semiconductor layer is n side semiconductor layer when the first nitride semiconductor layer is p side semiconductor layer.

It is particularly favorable for the first nitride semiconductor layer to be a formed by a multilayer film. For example, if the first nitride semiconductor layer is an n-side nitride semiconductor layer composed of a multilayer film, then the first n-side semiconductor layer is $Al_xGa_{1-x}N$ ($0 \leq x \leq 0.5$), and preferably $Al_xGa_{1-x}N$ ($0 \leq x \leq 0.3$). Specific growth conditions include a growth temperature of at least 1000° C. and a pressure of no more than 760 Torr in a reaction furnace. The first n-side semiconductor layer can also function as a cladding layer. The film thickness is favorably about 0.5 to 5 μm.

The second n-side semiconductor layer can function as an optical guide layer, and can be formed from $Al_xGa_{1-x}N$ ($0 \leq x \leq 0.3$). The film thickness is favorably 0.5 to 5 μm.

The active layer may have either a multiple quantum well structure or a single quantum well structure, but preferably has a general formula of $In_xAl_yGa_{1-x-y}N$ ($0 < x \leq 1$, $0 \leq y < 1$, $0 < x+y \leq 1$) containing at least indium. Light in the ultraviolet band can be emitted by raising the aluminum content. Light of a longer wavelength can also be emitted, and emission from 360 nm up to 580 nm is possible. Forming the active layer with a quantum well structure improves emission efficiency. An n-type impurity or p-type impurity may also be added to the quantum layer and/or a barrier layer during the growth of the active layer. Accordingly, there may be situations when two or more different impurities are contained in the optical output region at the resonator end faces. For example, a first impurity that widens the bandgap of the active layer may be contained in the optical output region at the resonator end faces, and a second impurity may be contained as a carrier in a barrier layer. In this case, if the first impurity is oxygen, the second impurity can be silicon.

Furthermore, with the present invention, a protective film is preferably formed in step (b) after the active layer has been formed, but the second nitride semiconductor layer may be laminated immediately after the formation of the active layer, that is, before the protective film is formed in step (b) (discussed below). If an ion species is to be implanted after this, however, the presence of the active layer near the surface allows the active layer itself to be easily restored or made transparent after the implantation of the ion species, so it is preferable for the second nitride semiconductor layer to have a laminated structure and only a part thereof to be formed, as will be discussed below. For example, just the first p-side semiconductor layer (discussed below) may be formed.

Figure 9A:
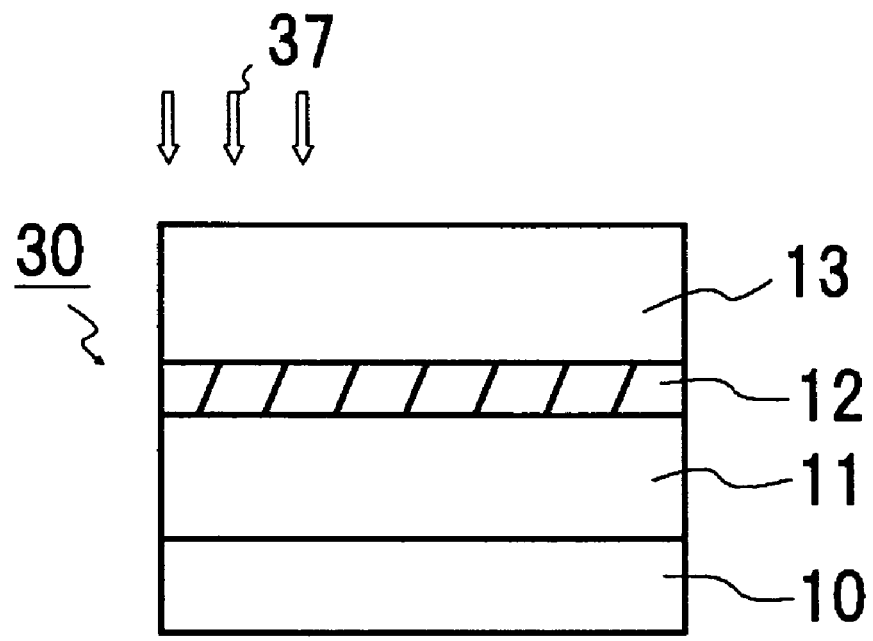
FIGS. 9a and 9b are simplified cross sectional process diagrams illustrating a conventional method for manufacturing a nitride semiconductor laser element.
Figure 9B:
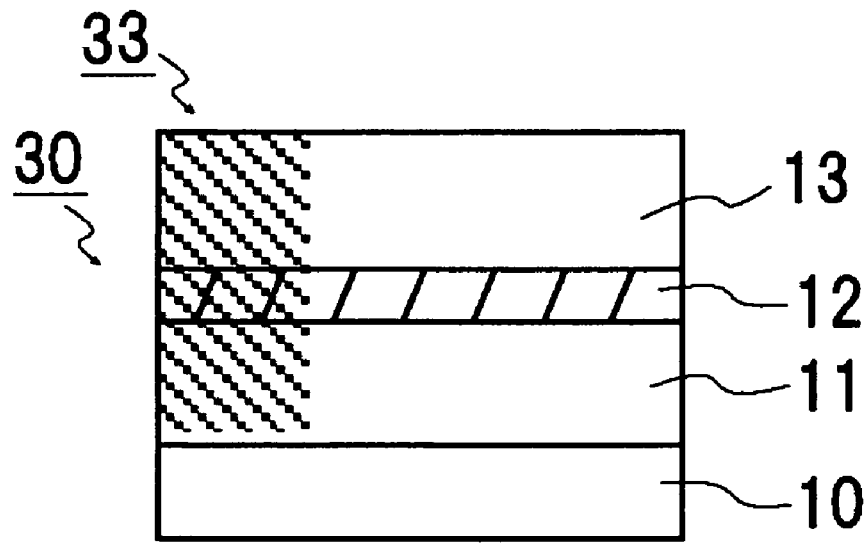

By thus implanting the ion species via a protective layer (as discussed below) after the active layer has been formed, or after just a part of the second nitride semiconductor layer has been formed, the ion species can be implanted in a more concentrated fashion at the desired depth (location), and the unnecessary implantation of an ion species into the nitride semiconductor layer can be eliminated by removing the protective layer, so a thorough crystal restoration can be anticipated in the nitride semiconductor layer constituting the element, and the effect discussed above can be obtained more effectively. On the other hand, if ion implantation is performed after lamination up to the n layer, the active layer, and the p layer as was described for the prior art in FIG. 9, crystallinity is damaged to such an extent that it cannot be adequately restored.

In step (b), a protective layer having a first region and a second region is formed over the active layer. If part of the second nitride semiconductor layer has been formed over the active layer, this protective layer is formed over that.

There are no particular restrictions on the protective layer here as long as it is a material that can be completely removed from the nitride semiconductor layer after the implantation of the ion species (discussed below), and a variety of types can be formed, such as an insulator layer (such as silicon oxide, silicon nitride, aluminum oxide, aluminum nitride, resist), a conductor layer, a metal layer (such as aluminum), or a semiconductor layer, either as a single layer or laminated layers. For example, it is favorable to use a single resist layer or a resist laminated with silicon oxide. When these are used, they can be completely and simply removed, without damaging the active layer or the like, by any commonly used etching process. It is preferable for a material layer containing an n-type impurity with respect to the nitride semiconductor layer not to be formed as a protective layer over a region intended for light emission. This prevents an increase in voltage in the resulting laser element.

The protective layer includes a first region and a second region that is thicker than the first region. Forming a protective film in this manner means that thorough restoration of crystallinity can be anticipated because the impurity is contained (the impurity is introduced or ions implanted) locally, and more specifically, because the impurity concentration in the vertical direction, which is the lamination direction of the nitride semiconductor layer, is adjusted at the resonator end faces, and preferably the impurity concentration in the vertical and horizontal directions is adjusted at the resonator end faces, so the above-mentioned effects can be achieved while maintaining the other characteristics.

The "first region" referred to here will vary with the conditions under which the ion species is implanted (discussed below) and so forth, but refers to a region that is thin enough that the ion implantation will cause the ion species to go all the way through the protective layer, and the ion species can be introduced into the nitride semiconductor layer that is disposed under this layer. This first region need not be uniform over the entire region, and its thickness may vary in steps or as a slope. This allows the amount in which the ion species is implanted into the nitride semiconductor layer to be controlled according to the thickness. If the thickness of the first region varies, it is preferable for the center portion to be the thinnest. This is because it is possible to dispose the ion implantation region in the optical output region, both easily and favorably, by positioning the center portion of the first region of the protective film to be the optical output region of the obtained semiconductor laser element, that is, the optical output end face of the resonator. For example, the thickness of the first region will vary with the ion species implantation conditions (discussed below) and so forth, but a range of about 100 Å to 2 µm is favorable, for example. There are no particular restrictions on the size and shape of the first region, but the size and shape must be such that, for example, at least the optical output side of the resonator end faces of the semiconductor laser element that is to be obtained overlaps with the region where the first region is disposed. For instance, at the resonator end faces of the laser element, and width is from 1 to 20 times the ridge width, and more specifically, the length (such as X in FIG. 2a) is about 1 to 50 µm, and is about 0.1 to 3% the resonator length of the laser element, and more specifically, the length (such as Y in FIG. 2a) is about 1 to 20 µm, with examples of plan view shapes including a quadrangular shape (rectangular; see FIG. 2b, for example), diamond shape (see FIG. 2a, for example), parallelogram shape, polygonal, circular, elliptical (see FIG. 2c, for example), cruciform (see FIG. 2d, for example), and star shaped. It is particularly favorable for the shape to wider than the inside of the element on the resonator end face side. This allows the ion implantation region to be disposed over a wide surface area on just the resonator end face side, and efficiently prevents deterioration due to heat generation or the like near the end face while maintaining adequate light emission at the active layer. FIGS. 2a to 2d show a first region 21 and a second region 22 (discussed below) of the protective layer in one unit of a semiconductor laser element including the resonator end faces 30 on the optical output side, and also show the ridge 14 that serves as a reference for the position of the optical output region.

The "second region" referred to here refers to a region that is thick enough that the ion implantation will not cause the ion species to go all the way through the protective layer, and the ion species can be prevented from being implanted in the nitride semiconductor layer that is disposed under this layer. This second region need not have a uniform thickness over the entire region. For example, although the thickness of the second region will vary with the conditions under which the ion species is implanted (discussed below) and so forth, it is about 500 Å or more, for example, and preferably at least about 1 µm. There are no particular restrictions on the shape and size of the second region, but the size and shape must be such that the second region overlaps with substantially all of the region that contributes to the emission of light in the semiconductor laser element to be obtained (that is, the region other than that close to the resonator end faces in a unit element). This adequate light emission from the active layer in a unit element.

There are no particular restrictions on the protective layer, which may be formed by any known method. For example, a protective layer having first and second regions can be formed by forming a resist layer in a constant thickness over the entire surface of a nitride semiconductor layer, exposing with a mask of the desired shape, and developing, so that are part is left behind in the thickness direction in just a part of the region of the resist layer, and this region serves as the first region. Also, all of the material in the thickness direction can be removed in part of the region of the resist layer, so as to expose part of the surface of the nitride semiconductor layer, and a silicon oxide film can be formed, for example, thick enough to constitute the first region over the entire surface of the nitride semiconductor layer including this resist layer, thereby forming a protective layer in which the first region is a region in which this silicon oxide film is touching the nitride semiconductor layer, and the second region is a region in which the resist layer and the silicon oxide film are laminated.

In step (c), an ion species is implanted in the nitride semiconductor layer via the protective layer. There are no particular restrictions on the ion species here, which may be suitably selected according to the composition of the nitride semiconductor layer, the ion implantation method, and so forth. For instance, examples include at least one atom selected from the group consisting of oxygen, boron, aluminum, zinc, beryllium, carbon, magnesium, calcium, nitrogen and so forth. Of these, oxygen atoms are preferable because they are advantageous in terms of the crystal restoration of the nitride semiconductor layer after the implantation of the ion species. The implantation of the ion species can be suitably adjusted according to the thickness of the protective layer being used, the ion species, and so forth, but the implantation energy is from 10 to 300 keV, for example. It is particularly favorable for this energy to be 20 to 120 keV with oxygen, 15 to 100 keV with boron, and 40 to 240 keV with aluminum. A suitable dose is about $1 \times 10^{15}/cm^3$ to about $1 \times 10^{23}/cm^3$, and preferably about $1 \times 10^{16}/cm^3$ to about $1 \times 10^{20}/cm^3$, for example. Alternatively, the conditions may be adjusted so that the path of the ion species leads to the optical output region of the resonator end faces, or as shown in FIGS. 3a and 3b, the conditions may be adjusted so that the path is set to include the optical output region and lead to regions 31 (such as an inverse triangular shape or a substantially inverse triangular shape) and 32 (a top hat shape or a substantially top hat shape that is convex downward) expanded to the first nitride semiconductor layer 11 side in the vicinity of the optical output region.

Figure 8:
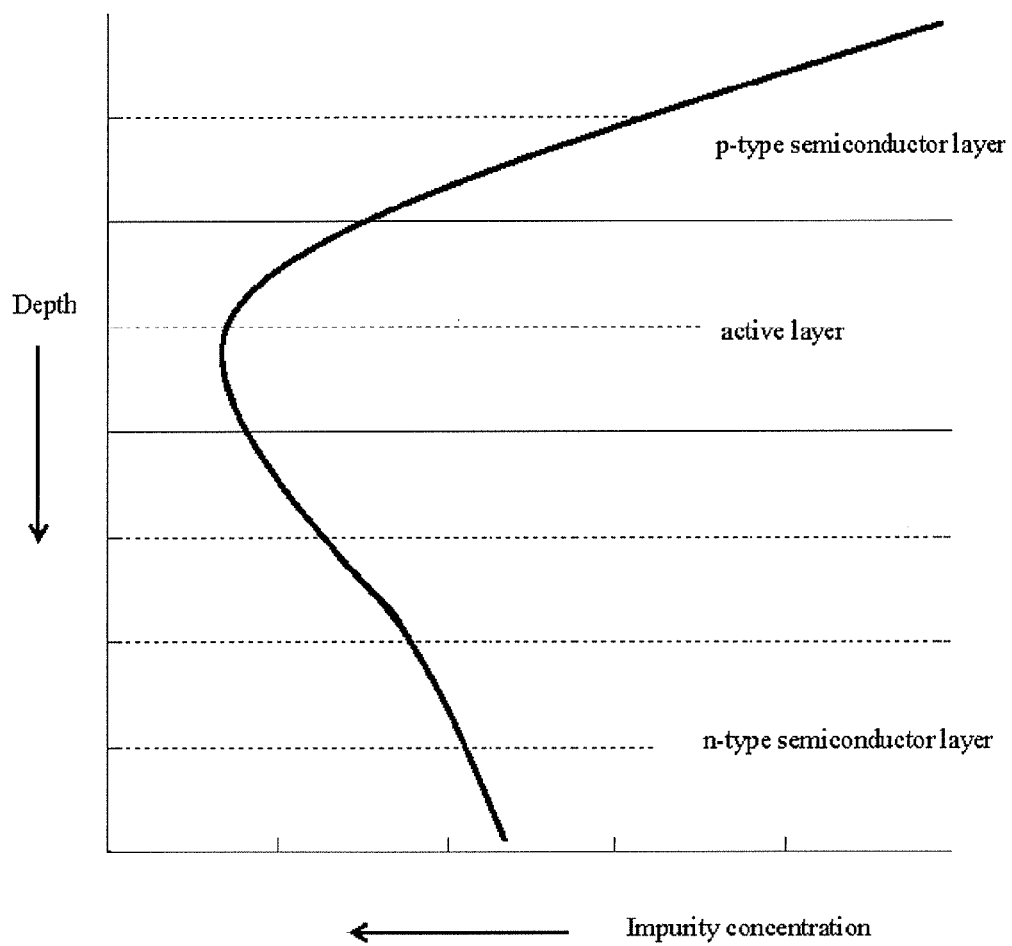
FIG. 8 is a graph of the impurity profile of the semiconductor layer of the nitride semiconductor laser element of the present invention.

With the manufacturing method of the present invention, as discussed above and below, the impurity implanted in the region corresponding to the optical output region is implanted so as to reach its peak before all of the second nitride semiconductor layer has been laminated, so as shown in FIG. 8, the profile of the impurity concentration has an asymmetric distribution in the lamination direction of the nitride semiconductor layer, based on the peak position of the active layer. In other words, the first nitride semiconductor layer side is set higher than the second nitride semiconductor layer side, and the total concentration of this impurity in the first nitride semiconductor layer is higher than the total concentration of this impurity in the second nitride semiconductor layer. This impurity concentration is also such that, at the resonator end faces, using the peak position as a reference, the attenuation to the second nitride semiconductor layer side is higher than the attenuation to the first nitride semiconductor layer side. That is, when the impurity is introduced, part of it is also introduced into the first nitride semiconductor layer, and the impurity diffused into the first nitride semiconductor layer in subsequent steps, so a considerable amount of impurity is introduced into the first nitride semiconductor layer. Meanwhile, since the second nitride semiconductor layer has not yet been laminated at the point when the impurity is introduced, no impurity is introduced into this layer, and very little impurity is diffused in subsequent steps. Thus, in the impurity concentration profile, the impurity concentration in the second nitride semiconductor layer decreases sharply compared to that in the active layer, but with the first nitride semiconductor layer, the impurity concentration decreases more slowly from the active layer. The impurity concentration referred to here is not the dopant concentration, in which p or n-type conductivity is intentionally imparted by doping, and instead refers to what is introduced in a different step from that of doping for imparting conductivity, with the aim of preventing the absorption of light at the resonator end faces.

The result of this ion implantation is that in the first region of the protective layer, the ion species goes through the protective layer and is introduced into the nitride semiconductor layer, and preferably the active layer, but in the second region, the ion species does not go through the protective layer, meaning that the ion species can be effectively trapped in the protective layer. Therefore, in dividing up the nitride semiconductor layer (discussed below), if the resonator end faces of the laser element are set to be within the first region, it will be possible to form a suitable region in which ions are implanted only near the resonator end faces, without leading to the destruction or deterioration of the nitride semiconductor layer itself in the portion that is intended to become the resonator end faces. As a result, the suitable changes to the crystal system, widening of the bandgap, changes to the composition of the nitride semiconductor layer, and so forth can be imparted in the proper positions, portions, and regions of the nitride semiconductor layer.

A heat treatment (annealing) for the crystal restoration of the nitride semiconductor layer, and particularly the active layer, is preferably performed after the ion implantation and either before or after steps (d), (e), and (f) as desired. This heat treatment may involve furnace annealing, RTA, or any other known method. For example, it can be favorably performed for about 5 to 200 minutes, at a temperature of about 700 to 1100° C., under an ammonia and/or nitrogen atmosphere, in an MOCVD apparatus. Alternatively, from another viewpoint, it is favorable to perform the heat treatment such that the optical transmissivity (of light of about 375 to 450 nm, for example) of the portion of the active layer where the ion species is implanted will be at least 100%, and preferably at least 101%, and even more preferably at least 105%, with at least 107% being better yet. If the optical transmissivity of the optical output region at the resonator end faces is at least 101%, then absorption of outputted light at the end face will be suppressed, and the reliability of the nitride semiconductor laser element will be improved. If the optical transmissivity of the optical output region at the resonator end faces is at least 105%, the suppression of the absorption of outputted light at the end face will be more pronounced. However, this heat treatment does not necessarily have to be carried out separately, and may be incorporated into a subsequent step in which heat is generated, such as the formation of the nitride semiconductor layer, an insulation film, a protective film, a conductive film, or the like. After the crystal restoration of the nitride semiconductor layer, or after the heat treatment, the ion species is diffused/introduced as the atoms that make up the crystals, or between the atoms that make up the crystals, from the implanted portion into the nitride semiconductor layer, and actually expands with respect to the portion where the ion species was implanted.

In step (d), the protective layer is removed. This removal of the protective layer can be accomplished by wet etching, dry etching, or any other method, as long as the method is one that allows the nitride semiconductor layer to be completely exposed without damaging the nitride semiconductor layer.

In step (e), the second nitride semiconductor layer is laminated over the nitride semiconductor layer (and preferably the active layer). If part of the nitride semiconductor layer has already been formed, then the appropriate layer is preferably formed over this. The first p-side semiconductor layer is $Al_xGa_{1-x}N$ ($0 \leqq x \leqq 0.5$) containing a p-type impurity. The first p-side semiconductor layer functions as a p-side electron confinement layer. The second p-side semiconductor layer can be formed from $Al_xGa_{1-x}N$ ($0 \leqq x \leqq 0.3$), and the third p-side semiconductor layer from $Al_xGa_{1-x}N$ ($0 \leqq x \leqq 0.5$) containing a p-type impurity. The third p-side semiconductor layer preferably is a superlattice structure composed of GaN and AlGaN, and functions as a cladding layer. The fourth p-side semiconductor layer can be formed from $Al_xGa_{1-x}N$ ($0 \leqq x \leqq 1$) containing a p-type impurity. Indium crystals may also be mixed into these semiconductor layers. The first p-side semiconductor layer and the second p-side semiconductor layer can be omitted. The thickness of each layer is favorably about 30 Å to 5 µm.

After this, if desired, the nitride semiconductor layer may be etched to expose the first nitride semiconductor layer (such as the first n-side semiconductor layer). This exposure can be accomplished, for example, by RIE using $Cl_2$, $CCl_4$, $BCl_3$, $SiCl_4$ gas, or the like. This allows stress to be relieved. Also, in the exposure of the first nitride semiconductor layer, the resonator face can be formed at the same time by etching so as to expose the end face perpendicular to the stripe-shaped waveguide region. However, the resonator face may instead be formed by cleavage in a step that is separate from the above. If the resonator end faces are formed at the same time, then the resonator end faces must be positioned so that the portion where the ion species was implanted, that is, under the region of the protective layer where the first region is disposed, becomes the resonator end face on the optical output side, and also the optical output region. This allows the portion where the ions are implanted just near the resonator end faces to be properly disposed, and the suitable changes to the crystal system, widening of the bandgap, changes to the composition of the nitride semiconductor layer, and so forth can be imparted just near the resonator end faces.

After this, the resistance of the second nitride semiconductor layer is preferably lowered by annealing the wafer in a reaction vessel at a temperature of at least 700° C. and in a nitrogen atmosphere. This step may be the same as another heat treatment step, however.

Next, a ridge is usually formed on the nitride semiconductor layer.

The ridge can be formed, for example, by forming a first mask pattern, and then etching using this first mask pattern. The first mask pattern can be formed in the desired shape, by photolithography and etching or any other know method, using an oxide film such as $SiO_2$ or a nitride such as SiN. The thickness of the first mask pattern is favorably such that the first mask pattern remaining on the ridge after the ridge has been formed can be removed by lift-off method in a subsequent step. About 0.1 to 5.0 µm is favorable, for example.

Then, the first protective film is formed over the nitride semiconductor layer exposed after the ridge formation. The first protective film can be formed by any method known in this field. The first protective film preferably has a thickness of about 100 to 5000 Å. Next, the first mask pattern and the first protective film present on the first mask pattern are removed. These can be removed by a known dry or wet etching process.

After this, a p-electrode is formed on the surface of the ridge. Ohmic annealing is preferably performed after the p-electrode has been formed. For example, the annealing can be favorably conducted under a nitrogen and/or oxygen-containing atmosphere and at 300° C. or higher, and preferably 500° C. or higher.

A second protective film 18 may be formed over the first protective film 15. The second protective film 18 can be formed by any method known in this field. A pad electrode 17 may also be formed over the p-electrode 16 if desired. The pad electrode 17 may be formed as a laminated film of a metal such as nickel, titanium, gold, platinum, lead, tungsten and the like.

An n-electrode is formed over all or part of the second main face of a nitride semiconductor substrate. For example, films of vanadium (100 Å thick), platinum (2000 Å thick), and gold (3000 Å thick) are formed from the substrate side. The n-electrode can be formed by sputtering, CVD, vapor deposition, or another such method. The use of a lift-off method in the formation of the n-electrode is preferred, and annealing is preferably performed at 500° C. or higher after the n-electrode has been formed. Further, a metallization-electrode may be formed over the n-electrode. The metallization-electrode may be formed of Ti—Pt—Au—(Au/Sn), Ti—Pt—Au—(Au/Si), Ti—Pt—Au—(Au/Ge), Ti—Pt—Au—In, Au/Sn, In, Au/Si, Au/Ge, and the like.

In step (f), in order to form the resonator end faces of the nitride semiconductor layer, the nitride semiconductor layer is divided up into bar shapes in any desired direction (such as perpendicular to the stripe-shaped ridge) so that the portion where the ion species was implanted will serve as the resonator end face on the optical output side. Here, the resonator end faces are preferably in the M plane (1-100) or the A plane (11-20). Examples of methods for dividing the nitride semiconductor layer include blade breaking, roller breaking, and press breaking.

A reflective mirror may be formed on the resonator end faces. The reflective mirror can be formed by an oxide film, a nitride film, an oxynitride film, a combination of these, or the like. More specifically, it is a dielectric multilayer film composed of $SiO_2$, $ZrO_2$, $TiO_2$, $Al_2O_3$, $Nb_2O_5$, SiN, AlN, SiON, AlON, or the like. It is also possible to select the mirror material according to the ion species to be implanted. For instance, when oxygen ions are implanted, adhesion between the semiconductor layer and the mirror can be improved by forming a mirror composed of an oxide film on the semiconductor layer side. When nitrogen ions are implanted, adhesion can be improved by forming a mirror composed of a nitride film on the semiconductor layer side. Also, using a stable film (such as $SiO_2$) for the outermost layer of the mirror allows the surface to be kept stable and suppresses deterioration that would occur over time during drive. The reflective mirror is preferably formed on the optical output face and/or optical reflection side of the resonation face. Also, it is preferably formed on both the optical output face and the optical reflection side of the resonation face. A reflective mirror can be formed with good reproducibility if the resonation end is formed by cleavage.

The resulting bar-shaped nitride semiconductor substrate can be divided in a direction parallel to the stripe direction of the ridge to form device chips.

After step (e), it is believed that the crystal system of the nitride semiconductor layer has been substantially restored in the nitride semiconductor laser element that is finally obtained, but the bandgap of the portion of the active layer where the ion species has been implanted must be different from the bandgap of the other portions of the active layer. Alternatively, from another viewpoint, the composition of the portion of the active layer where the ion species has been implanted must be different from the composition of the other portions of the active layer. Furthermore, as mentioned above, the optical transmissivity must be restored to at least about 100%. This effectively prevents end face damage by generated heat.

Figure 6A:
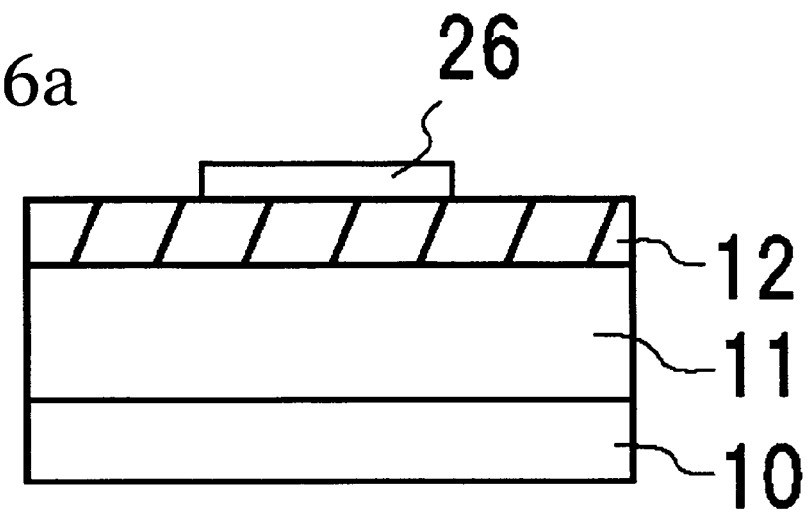
FIGS. 6a to 6c are simplified cross sections illustrating the method for manufacturing a nitride semiconductor laser element of the present invention.
Figure 6B:
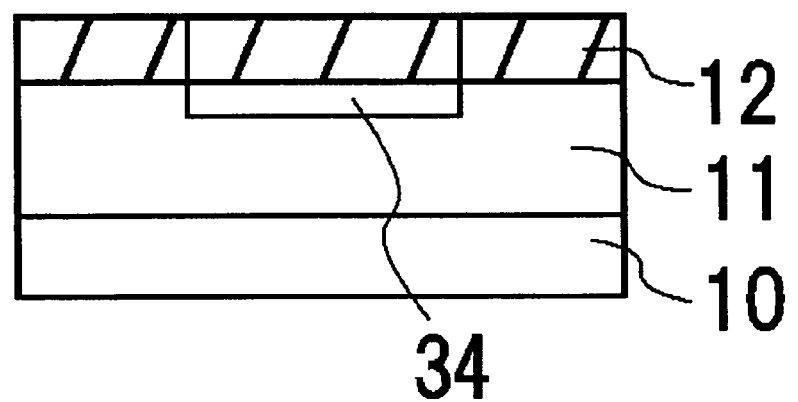
Figure 6C:
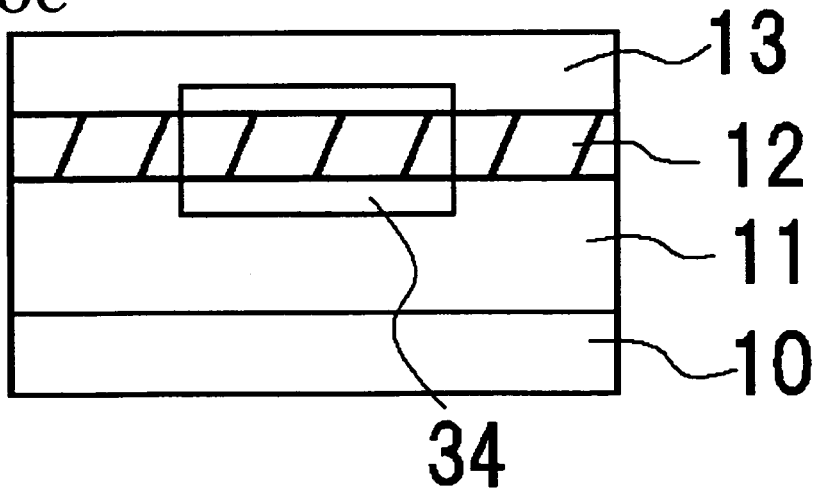

With the present invention, instead of utilizing ion implantation as in the manufacturing method discussed above, an impurity may be introduced into at least the optical output region at the resonator end faces by a diffusion method such as solid phase diffusion. In this case, as shown in FIG. 6a, for example, the same method as discussed above is used to form the n-side semiconductor layer 11 and the active layer 12 as first nitride semiconductor layers on the substrate 10, after which a film containing the impurity to be introduced (if the impurity is oxygen atoms, for example, an oxide film such as the $SiO_2$ film 26) is formed at a position corresponding to the first region of the protective film discussed above, an impurity introduction region 34 is formed by diffusion as shown in FIG. 6b by heat treating under the conditions given above, and then, as shown in FIG. 6c, the p-side semiconductor layer 13 is laminated as the second nitride semiconductor layer.

Also, at the resonator end faces, a region containing a second impurity may be disposed in the surface region of the second nitride semiconductor layer on the resonator end face side, independently from the above-mentioned impurity-containing region formed in the optical output region (hereinafter sometimes referred to as the "first impurity region"). This second impurity region is preferably disposed at a depth of 100 to 5000 Å, and more preferably 100 to 1000 Å, from the surface of the second nitride semiconductor layer. This region extends back the same distance as the above-mentioned impurity-containing region (the first impurity region). The phrase "formed independently" as used here means that the concentration distribution of this impurity at the resonator end faces is reduced between the two regions to the extent that they do not performed their intended functions as discussed above, and means, for example, that a value substantially close to zero is exhibited between the two. However, the two regions do not necessarily have to share the same impurity type, concentration, width, and length. This effectively prevents short circuiting with the nitride semiconductor layer at the end face of the p-electrode, and also effectively prevents the flow of current from the nitride semiconductor layer surface to the resonator end faces.

The second impurity region may be a region in which the resistance of the second nitride semiconductor layer is raised. In contrast, the first impurity region is intended to suppress optical absorption in the optical output region, and as long as they provide their respective effects, the second impurity and the first impurity may have the same concentration, or the first impurity concentration may be higher than the second impurity concentration. Also, the first and second impurities may be the same or different impurities. The second impurity concentration is favorably about $1\times10^{17}$ to $1\times10^{23}/cm^3$.

If the impurity has two or more peak positions in the lamination direction of the nitride semiconductor layer at the resonator end faces, then short circuiting at the interface between the nitride semiconductor layer and the electrode that occurs as a result of the concentration of excessive current at the electrode end can be suppressed by disposing these peak positions in the active layer and the second nitride semiconductor layer.

In another aspect of the present invention, at least one element that makes up a dielectric film formed so as to cover the resonator end face on the optical output side, and at least one element that makes up the above-mentioned nitride semiconductor layer are the same, and an impurity-containing region that contains an impurity that increases the lattice constant of the nitride semiconductor layer can also be formed at the resonator end face on the optical output side of the first nitride semiconductor layer and/or the second nitride semiconductor layer. The impurity-containing region may also be formed in just the first nitride semiconductor layer or just the second nitride semiconductor layer. This relieves stress between the resonator end face and the dielectric film, stabilizes the adhesion between the resonator end face and the dielectric film, and provides a nitride semiconductor laser element that exhibits good reliability even under continuous drive in a high output state.

With the nitride semiconductor laser element in this aspect, the same element that makes up both the nitride semiconductor layer and the dielectric film is preferably nitrogen, and even more preferably includes at least one element selected from the group consisting of aluminum, indium, and gallium. The dielectric film is preferably composed of a nitride, oxide, or oxynitride of aluminum.

The impurity concentration peaks are located in the first nitride semiconductor layer and/or second nitride semiconductor layer. The first nitride semiconductor layer and/or second nitride semiconductor layer is made up of a plurality of layers, and the impurity-containing region is formed over a plurality of layers. The impurity-containing region preferably includes at least one element selected from the group consisting of indium, arsenic, phosphorus, antimony, zinc, thallium, bismuth and the like.

Examples of the nitride semiconductor laser element, and the method for manufacturing the same, of the present invention will now be described in detail through reference to the drawings.

EXAMPLE 1

As shown in FIG. 1a, the nitride semiconductor element in this working example comprises the n-side semiconductor layer 11, the active layer 12, and the p-side semiconductor layer 13 as nitride semiconductor layers formed in that order over the substrate 10. The stripe-like ridge 14, which extends in the resonator direction, is formed on the surface of the p-side semiconductor layer 13. The p-electrode 16 is formed on the upper face of the ridge 14, and the n-electrode 20 on the lower face of the substrate 10.

With this nitride semiconductor laser element, the opposing resonator end faces are made up of two faces, on the optical output side and the monitor side, in the lengthwise direction of the ridge 14, and a region in which ions are implanted is formed as an impurity introduction region 39 at the resonator end faces on the optical output side, in at least the optical output region, that is, the portion direction below the ridge 14, with the active layer 12 in the center.

This nitride semiconductor laser element can be manufactured as follows.

Figure 4A:
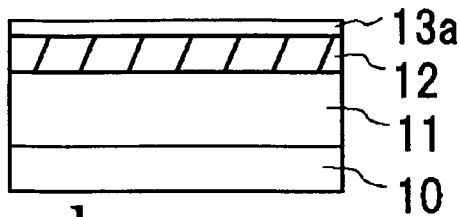
FIGS. 4a to 4e and 4c' to 4e' are simplified cross sections illustrating the method for manufacturing a nitride semiconductor laser element of the present invention.

First, as shown in FIG. 4a, a first n-side semiconductor layer (Si doped: $8\times10^{17}/cm^3$ to $3\times10^{18}/cm^3$, $Al_{0.02}Ga_{0.98}N$, 3.5 μm thick), a second n-side semiconductor layer (Si doped: $2\times10^{18}/cm^3$ to $1\times10^{19}/cm^3$, $In_{0.06}Ga_{0.94}N$, 0.15 μm thick), a third n-side semiconductor layer (a superlattice structure in which total 1.2 μm thick each of a 25 Å undoped $Al_{0.038}Ga_{0.962}N$ and a Si doped ($8\times10^{17}/cm^3$ to $3\times10^{18}/cm^3$) GaN), and a fourth n-side semiconductor layer (undoped GaN, 0.17 μm thick) are formed as the n-side semiconductor layer 11 on a GaN substrate 10. Then, a barrier layer (140 Å) composed of silicon-doped $In_{0.02}Ga_{0.98}N$ and a well layer (70 Å) composed of undoped $In_{0.07}Ga_{0.93}N$ are alternately laminated two times, and a barrier layer is formed over this to form an active layer 12 with a multiple quantum well (MQW) structure with a total thickness of 560 Å. A first p-side semiconductor layer (Mg doped: $1\times10^{19}/cm^3$ to $1\times10^{20}/cm^3$, $Al_{0.25}Ga_{0.75}N$, 100 Å μm thick) 13a is then formed as part of a p-side semiconductor layer 13 over the active layer 12.

Figure 4B:
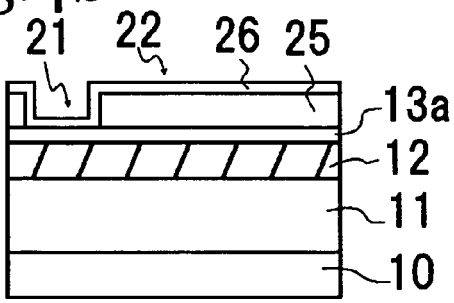

As shown in FIG. 4b, a resist layer 25 (2 μm thick) is formed over the entire surface of the first p-side semiconductor layer 13a, and a specific region of this resist layer 25 is removed in a rectangular shape by photolithography and etching. After this, an $SiO_2$ film 26 (0.1 μm thick) is formed over the entire surface of the resulting resist layer 25 to form a protective layer having a first region 21 and a second region 22.

Figure 4C:
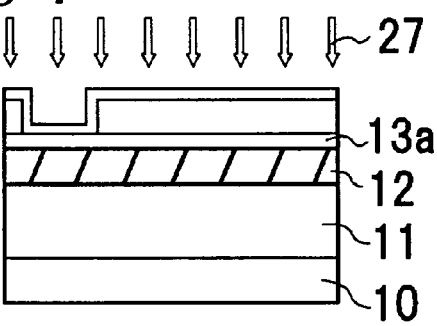
Figure 4C:
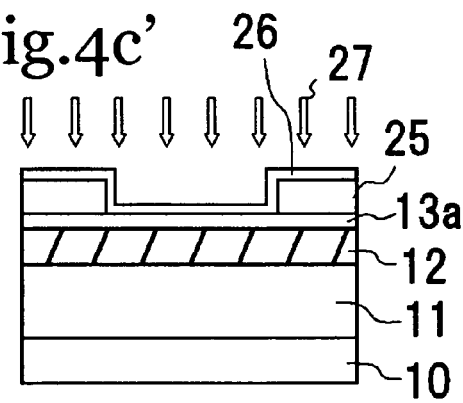

Then, as shown in FIGS. 4c and 4c', the protective layer thus formed is used as a mask to implant oxygen ions in the nitride semiconductor layer at an acceleration energy of 45 keV and a dose of $1\times10^{16}/cm^2$. Here, the oxygen ions do not go through the protective layer in the second region 22 of the protective layer, and are instead trapped in the protective layer, while in the first region 21, the oxygen ions do pass through the protective layer and are implanted in the nitride semiconductor, forming an ion implantation region 19 as shown in FIGS. 4d and 4d'.

Figure 4D:
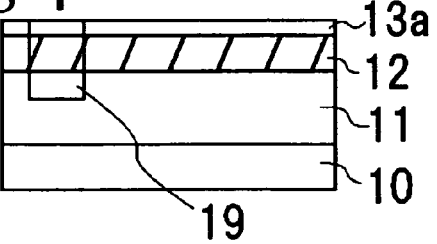
Figure 4D:
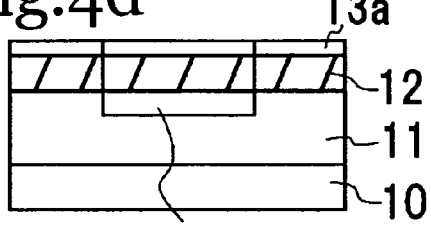

After this, as shown in FIGS. 4d and 4d', the $SiO_2$ film 26 is removed with BHF, and the resist layer 25 is removed with a stripping solution to completely remove the protective layer.

Next, the wafer is annealed in a reaction vessel at a temperature of at least 700° C. and in a nitrogen atmosphere. This heat treatment simultaneously restores the crystals of the ion implantation region 19, and improves the transparency of the portion where the ions are implanted. However, this step may be carried out simultaneously with the step of forming the remaining p-side semiconductor layer, or may be carried out after the fourth p-side semiconductor layer has been formed.

Figure 4E:
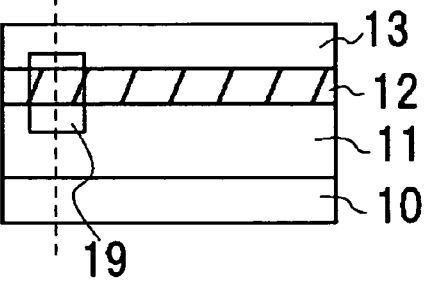
Figure 4E:
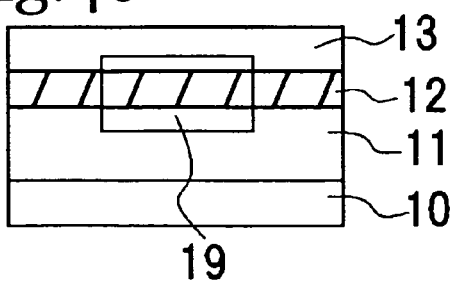

Then, as shown in FIGS. 4e and 4e', the second p-side semiconductor layer (undoped GaN, 0.15 μm thick), the third p-side semiconductor layer (a superlattice structure in which total 0.45 μm thick each of a 25 Å undoped $Al_{0.10}Ga_{0.90}N$ and a Mg doped ($1.25\times10^{19}/cm^3$) GaN), and the fourth p-side semiconductor layer (Mg doped ($1\times10^{20}$/cm$^3$) GaN, 150 Å thick) are formed over the first p-side semiconductor layer.

A first mask pattern composed of $SiO_2$ is formed over the p-side semiconductor layer 13, and this mask is used to etch and form a ridge.

A first protective film is then formed over the nitride semiconductor layer exposed after the formation of the first mask pattern and the ridge. The first protective film can be formed by any method known in this field.

Next, the first mask pattern and the first protective film present on the first mask pattern are removed, a p-electrode is formed on the surface of the ridge 14, and an n-electrode is formed on the second main face of the nitride semiconductor substrate.

After this, blade breaking is utilized to divide up the nitride semiconductor layer in a direction perpendicular to the ridge 14 and at a location overlapping the ion implantation region 19, that is, at the location indicated by the dotted line in FIG. 4e.

With a nitride semiconductor laser element formed by this manufacturing method, the ion implantation region 19 has a composition that is different from that of other regions besides the ion implantation region 19 in the active layer 12, and its bandgap is wider than that of other regions.

Therefore, the generation of heat can be effectively prevented at the resonator end faces, end face destruction can be prevented, the COD level can be raised, and the service life can be extended.

Figure 7:
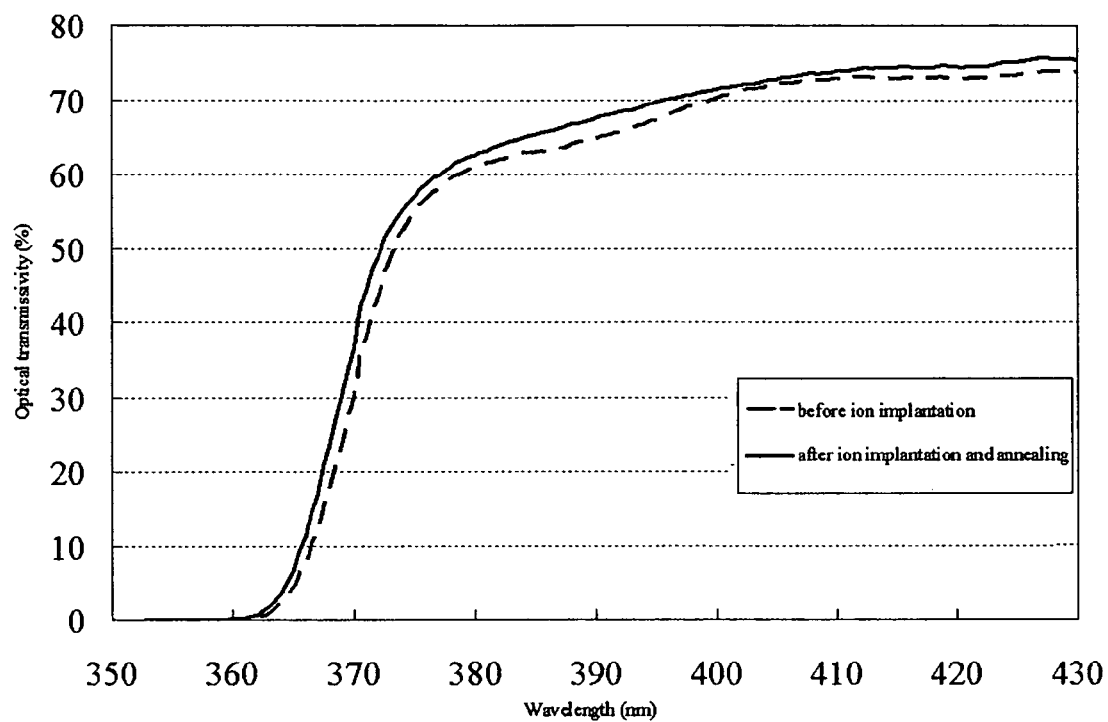
FIG. 7 is a graph illustrating the optical transmissivity of the semiconductor layer in the nitride semiconductor laser element of the present invention.

Semiconductor layers were laminated on the basis of the manufacturing method described above, and the optical transmissivity of the semiconductor layers prior to the implantation of ions was measured. The optical transmissivity was also measured after ions had been implanted and a heat treatment performed. These results are shown in FIG. 7. In FIG. 7, the broken line indicates the transmissivity before ion implantation, while the solid line indicates the transmissivity after ion implantation and heat treatment.

FIG. 7 confirms that the crystal system, that is, the transparency and/or optical transmissivity, is restored to a higher level than before the implantation of the ion species. The optical transmissivity is 103% or higher. If a nitride semiconductor layer is thus formed, and then ion implantation performed, and then heat treatment, and then the remaining nitride semiconductor layer is formed, crystal destruction in the nitride semiconductor layer is suppressed, and crystal restoration is promoted.

EXAMPLE 2

A nitride semiconductor laser element was manufactured by substantially the same method as in Example 1, except that the shape and thickness of the first and second regions in the protective layer were different.

Figure 5A:
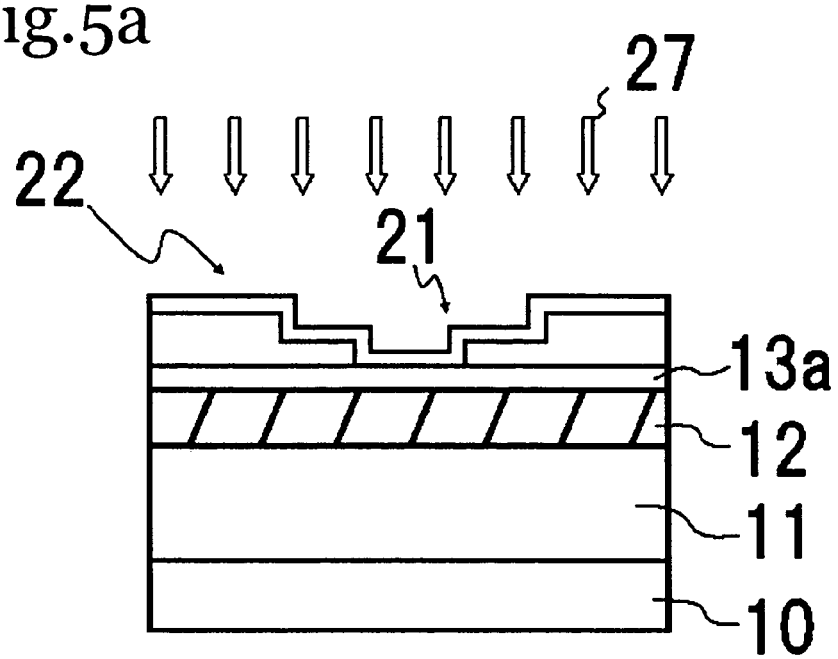
FIGS. 5a to 5c are simplified cross sections illustrating the method for manufacturing a nitride semiconductor laser element of the present invention.

As shown in FIG. 5a, the first region 21 of the protective layer changes in two steps when viewed in the resonator end face direction. The thickness of the second region 22 was the combined thickness of the resist layer (2 µm) and the $SiO_2$ film (0.1 µm), and the thickness of the first region 21 was 0.3 µm and 0.1 µm (corresponding to the thickness of the $SiO_2$ film), respectively. A protective layer of this shape is obtained by performing the exposure of the resist layer in two stages, with one exposure being greater than the other, and developing the resist layer.

Figure 5B:
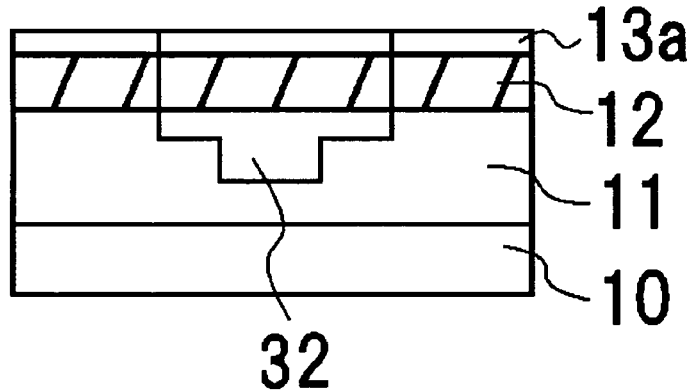

As shown in FIG. 5b, using a protective layer such as this allows the ion implantation region 32 to be expanded to the n-side semiconductor layer 11 side, and this allows the beam outputted from the optical output region to be moved to the n-side semiconductor layer 11 side.

Figure 5C:
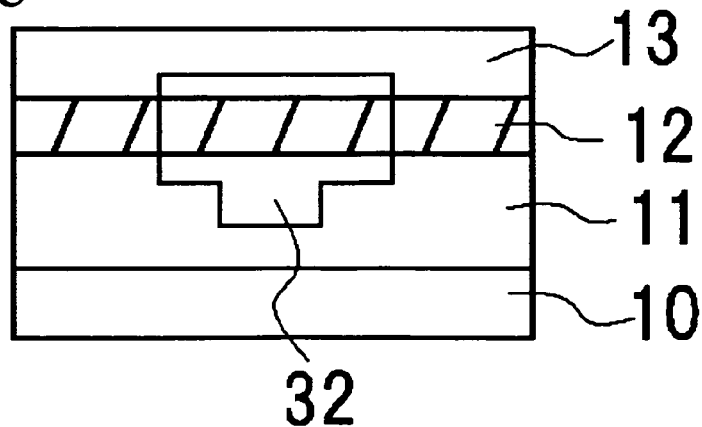

After this, as shown in FIG. 5c, the p-side semiconductor layer 13 is formed and the semiconductor laser element is completed in the same manner as in Example 1.

With the nitride semiconductor laser element formed by this manufacturing method, the COD level can be raised, and the service life can be extended the same as in Example 1.

Again with this semiconductor laser element, changing the shape of the region in which ions are implanted allows the shape of the beam outputted from the optical output region, the optical density, and so forth to be controlled.

EXAMPLE 3

A nitride semiconductor laser element was manufactured by substantially the same method as in Example 1, except that the shape and thickness of the first and second regions in the protective layer were different.

That is, the first region of the protective layer changed in a slope when viewed in the resonator end face direction. In other words, the thickness of the second region 22 was the combined thickness of the resist layer (2 µm) and the $SiO_2$ film (0.1 µm), and the thickness of the thinnest part of the first region was 0.1 µm (corresponding to the thickness of the $SiO_2$ film), with the thickness changing continuously from the first region to the thinnest part of the first region.

As shown in FIG. 3a, the ion implantation region 31 can be formed by using this protective layer to implant ions.

With the nitride semiconductor laser element formed by this manufacturing method, the COD level can be raised, and the service life can be extended the same as in Example 1.

Again with this semiconductor laser element, changing the shape of the region in which ions are implanted allows the shape of the beam outputted from the optical output region, the optical density, and so forth to be controlled.

INDUSTRIAL APPLICABILITY

The nitride semiconductor laser element of the present invention can be utilized in optical disk applications, optical communications systems, printers, exposure applications, measurements, and so forth. Also, the nitride semiconductor laser element of the present invention can be utilized in bio-related excitation light sources and the like that are capable of detecting the presence or the location of a substance having sensitivity to a specific wavelength by irradiating the substance with light obtained from a nitride semiconductor laser.

This application claims priority to Japanese Patent Application Nos. 2006-17569 and 2006-353718. The entire disclosure of Japanese Patent Application Nos. 2006-17569 and 2006-353718 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

The invention claimed is:

1. A nitride semiconductor laser element having:
a nitride semiconductor layer comprising a first nitride semiconductor layer, an active layer, and a second nitride semiconductor layer laminated in a lamination direction in that order, said nitride semiconductor layer having resonator end faces formed at both ends thereof; and, an impurity introduction region formed at least in an optical output region of one of the resonator end faces, with said impurity introduction region having a concentration distribution that is asymmetric in the lamination direction with respect to a peak position having a highest impurity concentration, and said impurity introduction region having a wider bandgap than other regions in the active layer.

2. The nitride semiconductor laser element according to claim 1, wherein
the impurity concentration in said impurity introduction region is higher on the first nitride semiconductor layer side than on the second nitride semiconductor layer side.

3. The nitride semiconductor laser element according to claim 1, wherein
the impurity concentration in said impurity introduction region has a higher attenuation rate at the resonator end faces to the second nitride semiconductor layer side, using the peak position as a reference, than the attenuation rate to the first nitride semiconductor layer side.

4. The nitride semiconductor laser element according to claim 1, wherein
the other regions on the active layer are regions on both sides of the optical output region of one the resonator end faces.

5. The nitride semiconductor laser element according to claim 1, wherein
said impurity introduction region on the resonator end faces is in the form of an inverted triangle or of a top hat shape that is convex downward.

6. The nitride semiconductor laser element according to claim 1, wherein
said impurity introduction region on the resonator end faces is wider than a with of said impurity introduction region in a inner side of the nitride semiconductor layer.

7. The nitride semiconductor laser element according to claim 1, wherein
the impurity includes at least one atom selected from the group consisting of oxygen, boron, aluminum, zinc, beryllium, carbon, magnesium, calcium and nitrogen.

8. The nitride semiconductor laser element according to claim 1, wherein
the impurity is introduced by ion implantation.

9. The nitride semiconductor laser element according to claim 1, wherein
said nitride semiconductor layer includes a stripe-like ridge on the surface of the second nitride semiconductor layer.

10. The nitride semiconductor laser element according to claim 1, wherein
the impurity introduction region is formed in a part of a region extending from the resonator end face to an inner side of the nitride semiconductor layer.

11. A nitride semiconductor laser element having:
a nitride semiconductor layer comprising a first nitride semiconductor layer, an active layer, and a second nitride semiconductor layer laminated in a lamination direction in that order, said nitride semiconductor layer having resonator end faces formed at both ends thereof; and, an impurity introduction region formed at least in an optical output region of one of the resonator end faces, with said impurity introduction region having a concentration distribution that is asymmetric in the lamination direction with respect to a peak position having a highest impurity concentration, and said impurity introduction region having a higher impurity concentration than other regions in the active layer.

12. The nitride semiconductor laser element according to claim 11, wherein
the impurity concentration in said impurity introduction region is higher on the first nitride semiconductor layer side than on the second nitride semiconductor layer side.

13. The nitride semiconductor laser element according to claim 11, wherein
the impurity concentration in said impurity introduction region has a higher attenuation rate at the resonator end faces to the second nitride semiconductor layer side, using the peak position as a reference, than the attenuation rate to the first nitride semiconductor layer side.

14. The nitride semiconductor laser element according to claim 11, wherein
the other regions on the active layer are regions on both sides of the optical output region of one the resonator end faces.

15. The nitride semiconductor laser element according to claim 11, wherein
said impurity introduction region on the resonator end faces is in the form of an inverted triangle or of a top hat shape that is convex downward.

16. The nitride semiconductor laser element according to claim 11, wherein
said impurity introduction region on the resonator end faces is wider than a with of said impurity introduction region in a inner side of the nitride semiconductor layer.

17. The nitride semiconductor laser element according to claim 11, wherein
the impurity includes at least one atom selected from the group consisting of oxygen, boron, aluminum, zinc, beryllium, carbon, magnesium, calcium and nitrogen.

18. The nitride semiconductor laser element according to claim 11, wherein
the impurity is introduced by ion implantation.

19. The nitride semiconductor laser element according to claim 11, wherein
said nitride semiconductor layer includes a stripe-like ridge on the surface of the second nitride semiconductor layer.

20. The nitride semiconductor laser element according to claim 11, wherein
the impurity introduction region is formed in a part of a region extending from the resonator end face to an inner side of the nitride semiconductor layer.

* * * * *